United States Patent [19]
Braegas

[11] Patent Number: 5,303,413
[45] Date of Patent: Apr. 12, 1994

[54] AM RADIO RECEIVER WITH SWITCHABLE IF BANDWIDTH

[75] Inventor: Peter Braegas, Hildesheim, Fed. Rep. of Germany

[73] Assignee: Robert Bosch GmbH, Stuttgart, Fed. Rep. of Germany

[21] Appl. No.: 657,399

[22] Filed: Jan. 18, 1991

[30] Foreign Application Priority Data

Feb. 20, 1990 [DE] Fed. Rep. of Germany ....... 4005272

[51] Int. Cl.⁵ .............................................. H04B 1/12
[52] U.S. Cl. .................................... 455/266; 455/307; 455/340
[58] Field of Search ............... 371/5.5; 375/8, 4, 5, 375/14; 370/100.1; 340/825.44, 825.47, 825.48; 455/200.1, 45, 72, 161.3, 188.1, 190.1, 191.3, 192.1, 62, 63, 65, 307, 305, 339, 340, 32.1

[56] References Cited

U.S. PATENT DOCUMENTS

| | | | |
|---|---|---|---|
| 4,224,817 | 11/1978 | Takahashi et al. | 325/344 |
| 4,249,261 | 2/1981 | Ogita | 455/305 |
| 4,259,740 | 3/1981 | Snell et al. | 455/161.3 |
| 4,598,426 | 7/1986 | Shiojima et al. | 455/266 |
| 4,679,225 | 7/1987 | Higashiyama | 455/32.1 |
| 4,686,707 | 8/1987 | Iwasaki et al. | 455/200 |
| 4,761,797 | 8/1988 | Bickers | 375/4 |
| 4,761,829 | 8/1988 | Lynk, Jr. et al. | 455/312 |
| 4,817,820 | 3/1989 | Davis | 340/825.44 |
| 4,867,484 | 8/1989 | Roberts | 375/14 |
| 5,095,534 | 3/1992 | Hiyama et al. | 455/266 |

*Primary Examiner*—Reinhard J. Eisenzopf
*Assistant Examiner*—Lisa Charouel
*Attorney, Agent, or Firm*—Frishauf, Holtz, Goodman & Woodward

[57] ABSTRACT

A method for IF bandwidth switchover and an IF bandwidth switchover apparatus in an AM radio receiver are described. This kind of switchover is appropriate if radio transmitters not only transmit at the normal modulation bandwidth but also broadcast programs with an expanded bandwidth. To obtain optimal reception, the switchover is performed as a function of the reception conditions. To this end, the error rate of supplemental AM information, adjacent-channel interference and the signal strength can be evaluated. These criteria can be used either individually or in various combinations.

21 Claims, 1 Drawing Sheet

AM RADIO RECEIVER WITH SWITCHABLE IF BANDWIDTH

FIELD OF THE INVENTION

The invention relates to a method and apparatus for IF (intermediate frequency) bandwidth switchover.

BACKGROUND

High-quality radio reception in Europe has previously been attainable only with VHF transmitters. On the medium-wave or AM broadcast band, conversely, the audio quality is poor because of the low-frequency bandwidth of 4.5 kHz, which is limited by the 9 kHz channel separation or allocation pattern provided by government regulations, for example in Germany.

With only a few exceptions, medium-wave or AM transmitters were previously used for supraregional service to areas that were beyond the range of the VHF transmitters. The AM program was also broadcast over the VHF transmitters, however.

To widen the range of programs, an article by H. Fritsch, entitled "Mittelwelle, Akzeptanz durch mehr Klang" (which translates into English as: Broader Acceptance Through Better Sound), in the Journal Funkschau [Broadcast Review] 1990, No. 3, pp. 40-45, proposes sending AM's "own" programs over the AM band as well. The plan is to use a wider low-frequency bandwidth than has previously been the case in broadcasting. Experiments are intended to find out how this could be done, for which transmitters and frequencies and at what times of day, without disturbing adjacent transmitters.

Once these experiments are completed, if a broadband program is broadcast by various transmitters, then there will in the future be two types of transmitters, in the medium-wave range and perhaps in the long-wave range as well. One type of transmitter functions as before with a normal bandwidth, which fits into the usual 9 kHz pattern; the other transmitters will operate with bandwidth expansion.

To be able to receive the programs in the quality offered in each case, a departure from the previous design for radio receivers for a fixed intermediate frequency bandwidth must be made. Instead, the capacity for switchover of the IF filter must be provided, to attain optimal reception results in each case.

Although manual switchover is possible and is intrinsically conceivable, it is inconvenient, because varying medium-wave broadcasting conditions can engender fluctuations in the reception quality; when transmitters with an expanded bandwidth are received, these fluctuations can necessitate a switchover of the IF filter to a narrower bandwidth even while a transmission is in progress. This can be expected especially in vehicle radios, with increasing distance from where the transmitter is located.

THE INVENTION

It is an object of the invention to provide a method for IF bandwidth switchover in an AM radio receiver that enables automatic switchover of the IF bandwidth as a function of the program offerings and of the reception conditions.

The invention assumes that in the course of transmitter conversion, supplemental AM information will be broadcast along with the radio program; this information may contain a modulation bandwidth code, among other elements. Evaluation of this code would be useful to perform a switchover of the IF bandwidth.

However, this criterion does not take into account the various reception conditions to which a receiver is subjected. The concept of the invention is accordingly to evaluate in addition to a modulation bandwidth code of this kind, criteria that represent a measure of the quality of reception.

A first option is to evaluate the error rate of the supplemental AM information.

Interference in the form of noise, crackling or adjacent transmitters adulterates the supplemental AM information approximately to the extent that it also affects audio modulation. Evaluating the error rate is thus one option for forming a criterion, in terms of measurement, for when a reversible IF filter should be switched from "wide" to "narrow" or vice versa.

The threshold value for the error rate at which a switchover takes place can be ascertained by trial and error and also depends on the overall design of a radio system, or in other words on the cooperation between the receiver and the antenna. The term "high error rate" is understood to be an error rate that is above the empirically defined threshold value; a "low error rate" is one that is below this threshold value.

The term "wide IF bandwidth" is also understood to be a bandwidth that enables reproduction of the complete spectrum of the expanded-bandwidth transmission. The "narrow IF bandwidth", contrarily, is the conventional bandwidth up to now, which is tuned for the channel pattern, which is 9 kHz in Europe.

A second alternative provides that in addition to the modulation bandwidth code of the supplemental AM information, adjacent-channel interference signal is evaluated. Such a signal comes about if, in the channel adjacent to that of the transmitter being received, another strong transmitter can be received. This is because the superposition of the two carrier frequencies produces a differential frequency in terms of the pattern spacing; the amplitude of this frequency is also a measure of the interfering effect of the adjacent transmitter and can also be evaluated to bring about the bandwidth switchover.

Although this heterodyne sound is rendered inaudible by using band-eliminating filters in the receiver, there is nevertheless disturbance from the superposition of the modulation sidebands that would cause audible interference at the "wide" setting of the IF filter. The terms "major and minor adjacent-channel interference" again refer to an empirically defined threshold at which the switchover of the IF filter from wide to narrow and vice versa should occur.

A third alternative for evaluating reception conditions is to measure the signal strength. Besides noise and crackling that may occur, adjacent transmitters also punch through to an increasing extent, whenever the signal strength of the transmitter selected decreases relative to the adjacent transmitters. Analogously to the situation of the first two alternatives, the terms "high signal strength" and "low signal strength" again refer to a threshold at which a switchover of the IF filter should be performed.

Accordingly, a high signal strength includes all the values for signal strength that are above this empirically defined threshold; low signal strength includes all those values located below the threshold.

While it is possible in principle to use one of the above criteria exclusively, the possibility also exists of combining two, or all, of these criteria. It is conceivable to evaluate the error rate along with the adjacent-channel interference, to evaluate the adjacent-channel interference along with the signal strength, or to take the signal strength into account along with the error rate. Both combinatorial and alternative evaluation are possible.

In addition to combining two criteria, it is also possible to evaluate the error rate, adjacent-channel interference and signal strength together. Once again provisions based on a combinatorial evaluation and an alternative evaluation are conceivable.

In a further feature, if the transmission of supplemental AM information is not provided, then the criteria discussed above can nevertheless be used to perform a switchover of the IF filter. Although in that case, under particularly favorable reception conditions, the IF filter is switched to "wide" even when transmitters of normal bandwidth are being received, it has nevertheless been found that this has no disadvantages but instead can even improve the quality if the bandwidth for normal reception in the receiver is tailored more widely than would intrinsically be necessary from the standpoint of the channel pattern.

The invention also relates to an IF bandwidth switchover apparatus. In connection with this, its object is to improve an IF bandwidth switchover apparatus such that an automatic switchover is possible as a function of the program offering and of the reception conditions, to attain optimal reception quality.

The combination options and the attendant advantages are equivalent to those discussed above in conjuction with the method of the invention.

In a practical embodiment of a adjacent-channel interference evaluator, an oscillator circuit tuned for the channel pattern frequency is used in combination with a rectifier. The adjacent-channel interference evaluator can be connected either to the input side or the output side of the reversible IF filter. If it is on the output side, then there is already a preselection of the interference signal upon switchover, thus varying the mode of operation of the evaluator. This could cause an undersirably frequent switchover between wide and narrow. To overcome this problem, the evaluation and control circuit is accordingly provided with switching hysteresis.

BRIEF FIGURE DESCRIPTION:

Further features and advantageous embodiments of the invention are described in detail below and shown in FIG. 1, which is a block circuit diagram for an Am receiver with an automatic IF bandwidth switchover apparatus.

For the sake of simplicity, various possibilities for IF bandwidth switchover are shown in the diagram. This is not absolutely necessary in actual practice, however. A limitation to two criteria, or to only one criterion, to be used for the switchover of the IF filter may also be made.

DETAILED DESCRIPTION

Figure 1:
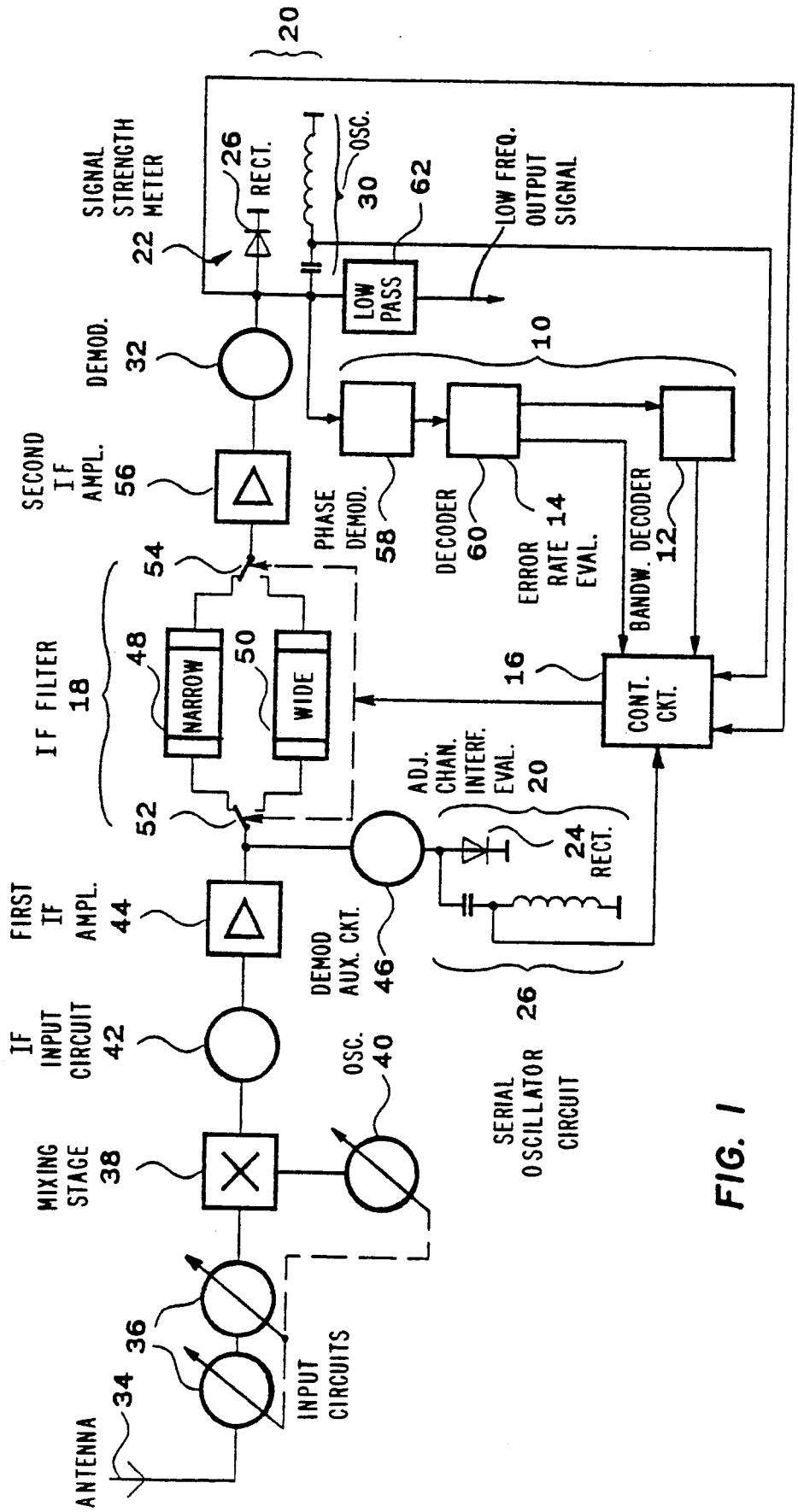

The subassemblies that are usually present in a conventional AM receiver will be introduced first. Received signals proceed from an antenna 34 via input circuits 36 to arrive at a mixing stage 38, in which the frequency of an oscillator 40 and an intermediate frequency are generated. The input circuits 36 and the oscillator 40 can be tuned in common.

The signals taken from the mixer 38 are carried via an IF input circuit 42 to a first IF amplifier 44 and amplified there. An IF filter 18 allows a primary selection of the signal through and definitively, by its bandwidth, determines the bandwidth of the LF signal appearing later at the output. The filter 18 is followed by a second IF amplifier 56, which is followed in the signal path by a demodulator circuit 32. A rectifier 26 and a low-pass filter 62, at the output of which the low frequency can be picked up, are located at the output of the demodulator circuit 32. To reduce adjacent-channel interference, an oscillator circuit 30 is usually also provided, embodied as a 9-kHz block. By means of a special embodiment of the filter 18, the AM receiver shown is capable of selectively receiving wide-band or narrow-band programs. In more detail, the IF filter 18 comprises a narrow IF filter 48 and a wide IF filter 50. A first switch 52 and a second switch 54 are located respectively at the output and input of the two filters; they are actuatable in common and switch either the narrow IF filter 48 or the wide IF filter 50 into the signal path. The switchover of the switches 52 and 54 is not done manually, however, but instead by means of an evaluation and control circuit 16, as the operation arrows indicate.

The evaluation and control circuit 16 receives signals from various subassemblies. The assumption is made in the receiver design described here that in addition to the AM modulation, supplemental AM information is also broadcast. Phase modulation is suitably employed to render this supplemental AM information inaudible. A phase demodulator 58 is used to demodulate this phase modulation; together with a supplemental information decoder 60 and a bandwidth decoder 12, this phase demodulator forms a subassembly that is used as a decoder 10.

Following the phase detector 58 is a digital data stream containing certain supplemental information, among which is a modulation bandwidth code. The data that are transmitted in this data s%ream are cyclically repeated. This means that even with occasional interruptions, it is certain that the information will continue to be received.

The data telegram suitably also includes data for verifying correct transmission, to enable reliable evaluation of the data. From the tests of these check data it is possible to determine the error rate; this is done in an error rate evaluator 14. The error rate evaluator 14 is integrated with the supplemental information decoder 60. From here, a signal line leads to the evaluation and control circuit 16, which signal line transmits a signal value corresponding to the error rate.

A further output of the supplemental information decoder 60 leads to a bandwidth decoder 12, which evaluates the modulation bandwidth code contained in the supplemental AM information and carries a corresponding switching signal to the evaluation and control circuit 16.

With the aid of the subassemblies described thus far, automatic switchover of the IF filter 18 is already possible, because the error rate is also a measure for interference of the audio program.

A adjacent-channel interference evaluator 20 is also included in the AM receiver circuit. This adjacent-channel interference evaluator 20 may be located on either the input or output side of the IF filter 18. When it is on the input side of the IF filter 18, the coarsely filtered intermediate frequency passes via a demodulation auxiliary circuit 46 to the adjacent-channel interference evaluator 20. This evaluator includes a rectifier 24 and a serial oscillator circuit 26. The serial oscillator circuit 26 receives the demodulated IF signal and is tuned for the channel pattern of 9 kHz, assuming that it is intended for European use. A signal line leads from the middle pickup of this oscillator circuit 26 to the evaluation and control circuit 16.

If broadcasting conditions in the AM reception result in an approximately equal reception level for the transmitter selected and for the transmitter adjacent to it on the dial, then if the IF filter 18 were set to "wide", superposition of the sidebands of the transmitter being received on the carrier of the adjacent transmitter or its sidebands would occur. This would cause annoying interference.

In this case, a 9-kHz interference tone appears at the rectifier 24 and excites the serial oscillator circuit 26. The amplitude of this interference signal is evaluated by the evaluation and control circuit 16 such that when there is irritating interference from the adjacent transmitter the bandwidth of the IF filter is switched over from wide to narrow.

The already existing combination of the rectifier 26 and the oscillator circuit 30 on the output side of the IF filter 18 can also be used as a adjacent-channel interference evaluator 20. Since the amplitude of the interfering signal depends on the particular position of the IF filter, however, hysteresis is provided for this application, resulting in a delayed switchover of the IF filter 18 by the evaluation and control circuit 16.

A third possibility for evaluating the reception quality is finally provided by a signal strength meter 22, which is practically formed by the already existing rectifier 26. From here, a signal line accordingly leads to the evaluation and control circuit 16. This circuit is embodied as a microprocessor and can evaluate the criteria either alternatively or in combination.

Various changes and modifications may be made, and features described in connection with any one of the embodiments may be used with any of the others, within the scope of the inventive concept.

I claim:

1. A method for IF bandwidth switchover in an AM radio receiver for receiving signals from respective transmitters which each modulate and transmit one of a normal narrow-bandwidth signal and an expanded or wide-bandwidth signal, in which the receiver has an adjustable IF filter and the transmitters broadcast supplemental AM information,
comprising the steps of
evaluating, in the AM radio receiver, a modulation bandwidth code contained in the supplemental AM information and an error rate of the supplemental AM information, and
selectively,
adjusting bandwidth of said IF filter (18) to a wide bandwidth if the modulation bandwidth indicated by said bandwidth code is expanded, and there is a low error rate, and
adjusting the bandwidth of said IF filter to a narrow bandwidth if the modulation bandwidth indicated by said bandwidth code is expanded, and there is a high error rate.

2. The method of claim 1, wherein additionally an adjacent-channel interference signal is evaluated, and if there is the expanded modulation bandwidth combined with at least one of the low error rate and a low adjacent-channel interference, then the wide bandwidth is selected,
and if there is a normal modulation bandwidth, or if there is at least one of the expanded modulation bandwidth combined with the high error rate and a high adjacent-channel interference, the narrow bandwidth is selected.

3. The method of claim 2, wherein the signal strength is additionally evaluated, and that
if there is the expanded modulation bandwidth combined with at least one of the low error rate, the low adjacent-channel interference and a high signal strength, the wide bandwidth is selected, and
if there is a normal modulation bandwidth, or if there is the expanded modulation bandwidth combined with at least one of the high error rate, the high adjacent-channel interference and a low signal strength, the narrow bandwidth is selected.

4. A method for IF bandwidth switchover in an AM radio receiver for receiving signals from respective transmitters which each modulate and transmit one of a normal narrow-bandwidth signal and an expanded or wide-bandwidth signal, in which the receiver has an adjustable IF filter and the transmitters broadcast supplemental AM information,
comprising the steps of
evaluating, in the AM radio receiver, a modulation bandwidth code contained in the supplemental AM information and an adjacent-channel interference signal of the supplemental AM information, and
selectively,
adjusting bandwidth of said IF filter (18) to a wide bandwidth if the modulation bandwidth indicated by said bandwidth code is expanded, and there is low adjacent-channel interference, and
adjusting the bandwidth of said IF filter to a narrow bandwidth if the modulation bandwidth indicated by said bandwidth code is expanded, and there is high adjacent-channel interference.

5. The method of claim 4, wherein additionally the signal strength is evaluated, and
if there is the expanded modulation bandwidth combined with at least one of the low adjacent-channel interference and a high signal strength, then the wide bandwidth is selected,
and if there is a normal modulation bandwidth, or if there is the expanded modulation bandwidth combined with at least one of the high adjacent-channel interference and a low signal strength, the narrow bandwidth is selected.

6. A method for IF bandwidth switchover in and AM radio receiver for receiving signals from respective transmitters which each modulate and transmit one of a normal narrow-bandwidth signal and an expanded or wide-bandwidth signal, in which the receiver has an adjustable IF filter and the transmitters broadcast supplemental AM information,
comprising the steps of
evaluating, in the AM radio receiver, a modulation bandwidth code contained in the supplemental AM information and a signal strength of the AM supplemental information from said transmitter, and
selectively,
adjusting bandwidth of said IF filter (18) to a wide bandwidth if the modulation bandwidth indicated by said bandwidth code is expanded, and there is a high signal strength, and adjusting the bandwidth of said IF filter to a narrow bandwidth if the modulation bandwidth indicated by said bandwidth code is expanded, and there is a low signal strength.

7. The method of claim 6, wherein additionally the error rate of the supplemental AM information is evaluated, and that with the expanded modulation bandwidth combined with at least one of a high signal strength and a low error rate, the wide bandwidth is selected, and if there is the normal modulation bandwidth, or if there is the expanded modulation bandwidth combined with at least one of the low signal strength and a high error rate, the narrow bandwidth is selected.

8. An IF bandwidth switchover apparatus in an AM radio receiver, for receiving signals from transmitters which each modulate and transmit one of a normal narrow-bandwidth signal and an expanded or wide-bandwidth signal, having a decoder (10) for supplemental AM information broadcast by the transmitters, wherein a bandwidth decoder (12), for evaluating a modulation bandwidth code contained in the supplemental AM information, and an error rate evaluator (14) for the supplemental AM information are provided, and the bandwidth decoder (12) and the error rate evaluator (14) are connected to an evaluation and control circuit (16), which sets a reversible IF filter (18) to "wide" if there is the expanded modulation bandwidth combined with a low error rate, and sets the filter to "narrow" if one of the following conditions pertains:

there is a normal modulation bandwidth, or there is the expanded modulation bandwidth combined with a high error rate.

9. The IF bandwidth switchover apparatus of claim 8, wherein additionally an adjacent-channel interference evaluator (20) is provided and said adjacent-channel interference evaluator is connected to the evaluation and control circuit (16), and the reversible IF filter (18) is set by the evaluation and control circuit (16) to "wide"

if there is the expanded modulation bandwidth combined with at least one of the low error rate and slight adjacent-channel interference, and is set to "narrow"

if there is a normal modulation bandwidth or if there is the expanded modulation bandwidth combined with at least one of the high error rate and a high adjacent-channel interference.

10. The IF bandwidth switchover apparatus of claim 9, wherein additionally a signal strength meter (22) is provided and it is likewise connected to the evaluation and control circuit (16), and the reversible IF filter (18) is set by the evaluation and control circuit (16) to "wide"

if there is the expanded modulation bandwidth combined with at least one of the low error rate, the slight adjacent-channel interference, and a high signal strength, and to "narrow"

if there is the normal modulation bandwidth, or if there is the expanded modulation bandwidth combined with at least one of the high error rate, high adjacent-channel interference and a low signal strength.

11. The IF bandwidth switchover apparatus of claim 8, wherein the evaluation and control circuit (16) includes a microprocessor.

12. An IF bandwidth switchover apparatus in an AM radio receiver, for receiving signals from transmitters which each modulate and transmit one of a normal narrow-bandwidth signal and an expanded or wide-bandwidth signal, having a decoder (10) for supplemental AM information broadcast by the transmitters, wherein a bandwidth decoder (12), for evaluating a modulation bandwidth code contained in the supplemental AM information, and an adjacent-channel interference evaluator (20) are provided, and the bandwidth decoder (12) and the adjacent-channel interference evaluator (20) are connected to an evaluation and control circuit (16), which sets a reversible IF filter (18) to "wide" if there is the expanded modulation bandwidth combined with slight adjacent-channel interference, and sets the filter to "narrow" if one of the following conditions pertains:

there is the normal modulation bandwidth, or there is the expanded modulation bandwidth combined with high adjacent-channel interference.

13. The IF bandwidth switchover apparatus of claim 12, wherein additionally a signal strength meter (22) is provided and it is likewise connected to the evaluation and control circuit (16), and the reversible IF filter (18) can be set be the evaluation and control circuit (16) to "wide"

if there is the expanded modulation bandwidth combined with at least one of a slight adjacent-channel interference and a high signal strength, and to "narrow"

if there is the expanded modulation bandwidth combined with at least one of the high adjacent-channel interference and a low signal strength.

14. The IF bandwidth switchover apparatus of claim 12, wherein the adjacent-channel interference evaluator (20) is connected on an input side of the reversible IF filter (18).

15. The IF bandwidth switchover apparatus of claim 18, wherein the adjacent-channel interference evaluator (20) is connected on an output side of the reversible IF filter (18) and the evaluation and control circuit (16) has a switching hysteresis.

16. The IF bandwidth switchover apparatus of claim 14, wherein the adjacent-channel interference evaluator (20) includes a rectifier (24, 26) and an oscillator circuit (28, 30) tuned for a channel pattern frequency.

17. The IF bandwidth switchover apparatus of claim 16, wherein the oscillator circuit (28, 30) is a serial resonant circuit, at a middle pickup of which the adjacent-channel interference can be picked up.

18. The IF bandwidth switchover apparatus of claim 13, wherein the signal strength meter (22) and the adjacent-channel interference evaluator (20) include a common rectifier (26).

19. An IF bandwidth switchover apparatus in an AM radio receiver, for receiving signals from transmitters which each modulate and transmit one of a normal narrow-bandwidth signal and an expanded or wide-bandwidth signal, having a decoder (10) for supplemental AM information broadcast by the transmitters, wherein a bandwidth decoder (12), for evaluating a modulation bandwidth code contained in the supplemental AM information, and a signal strength meter (22) are provided, and the bandwidth decoder (12) and the signal strength meter (22) are connected to an evaluation and control circuit (16), which sets a reversible IF filter (18) to "wide" if there is the expanded modulation bandwidth combined with at least one of high signal strength, and sets the filter to "narrow"

if there is a normal modulation bandwidth or if there is the expanded modulation bandwidth combined with low signal strength.

20. The IF bandwidth switchover apparatus of claim 19, wherein additionally an error rate evaluator (14) is provided and it is likewise connected to the evaluation and control circuit (16), and the reversible IF filter (18) is set by the evaluation and control circuit (16) to "wide"

if there is the expanded modulation bandwidth combined with at least one of a high signal strength and a low error rate, and to "narrow"

if there is the normal modulation bandwidth, or if there is the expanded modulation bandwidth combined with at least one of the low signal strength and a high error rate.

21. The IF bandwidth switchover apparatus of claim 19, wherein the signal strength meter (22) includes a rectifier (26) located on an output side of an IF demodulator circuit (32).

* * * * *